(12) United States Patent
Tolle

(10) Patent No.: US 8,921,207 B2
(45) Date of Patent: Dec. 30, 2014

(54) TIN PRECURSORS FOR VAPOR DEPOSITION AND DEPOSITION PROCESSES

(71) Applicant: ASM America, Inc., Phoenix, AZ (US)

(72) Inventor: John Tolle, Gilbert, AZ (US)

(73) Assignee: ASM IP Holding B.V., Inc. (NL)

( * ) Notice: Subject to any disclaimer, the term of this patent is extended or adjusted under 35 U.S.C. 154(b) by 0 days.

(21) Appl. No.: 13/783,762

(22) Filed: Mar. 4, 2013

(65) Prior Publication Data

US 2014/0087544 A1 Mar. 27, 2014

Related U.S. Application Data

(60) Provisional application No. 61/705,031, filed on Sep. 24, 2012.

(51) Int. Cl.
  *H01L 21/02* (2006.01)
  *C23C 16/30* (2006.01)
  *C23C 16/18* (2006.01)

(52) U.S. Cl.
  CPC .... *H01L 21/02384* (2013.01); *H01L 21/02535* (2013.01); *H01L 21/02532* (2013.01); *C23C 16/30* (2013.01); *H01L 21/02576* (2013.01); *C23C 16/18* (2013.01); *H01L 21/02579* (2013.01); *H01L 21/0262* (2013.01)
  USPC ........................................................ 438/478

(58) Field of Classification Search
  None
  See application file for complete search history.

(56) References Cited

U.S. PATENT DOCUMENTS

| 6,699,524 B2 | 3/2004 | Kesälä | |
|---|---|---|---|
| 7,238,596 B2 * | 7/2007 | Kouvetakis et al. | 438/507 |
| 7,589,003 B2 * | 9/2009 | Kouvetakis et al. | 438/507 |
| 2009/0087967 A1 * | 4/2009 | Todd | 438/507 |

OTHER PUBLICATIONS

Bauer et al., "Synthesis of ternary SiGeSn semiconductors on Si(100) via $Sn_xGe_{1-x}$ buffer layers", Applied Physics Letters, vol. 83, No. 11, pp. 2163-2165, Sep. 15, 2003.
Kouvetakis et al., "Independently tunable electronic and structural parameters in ternary Group IV semiconductors for optoelectronic applications", The $5^{th}$ International Symposium on Advanced Science and Technology of Silicon Materials (JSPS Si Symposium), Nov. 10-14, 2008, Kona, Hawaii, USA.
"Tetramethyl TIN", Material Safety Data Sheet, SAFC Hitech Enabeling Technology, www.sagchitech.com, 2 pages, Document created Jun. 4, 2007.
"Tin(IV) chloride", Material Safety Data Sheet, Sigma-Aldrich, sigma-aldrich.com, 7 pages, Revision Date Jan. 19, 2012.
Vincent et al., "Undoped and in-situ B doped GeSn epitaxial growth on Ge by atmospheric pressure-chemical vapor deposition", Appl. Phys. Lett. 99, 152103, Oct. 11, 2011.
Wang et al., "Low Temperature Epitaxial Growth of High Permittivity Rutile $TiO_2$ on $SnO_2$", Electrochemical and Solid-State Letters, vol. 13, No. 9, pp. G75-G78, Jun. 29, 2010.

* cited by examiner

*Primary Examiner* — Seahvosh Nikmanesh
(74) *Attorney, Agent, or Firm* — Knobbe, Martens, Olsen & Bear, LLP

(57) ABSTRACT

Sn-containing precursors for deposition of Sn-containing films and methods of using are provided herein. In some embodiments, Sn-containing precursors are methylated and/or hydrogenated and/or deuteriated. In some embodiments, methods of chemical vapor deposition are provided.

20 Claims, No Drawings

TIN PRECURSORS FOR VAPOR DEPOSITION AND DEPOSITION PROCESSES

CROSS REFERENCE TO RELATED APPLICATIONS

This application claims the benefit of U.S. Provisional Application No. 61/705,031, filed on Sep. 24, 2012, the entire content of which is hereby incorporated by referenced and should be considered part of the specification.

BACKGROUND OF THE INVENTION

1. Field of the Invention

The present application relates generally to the manufacturing of thin conductive films comprising tin (Sn), including vapor deposition of Group IV alloys of Sn.

2. Description of the Related Art

Films that contain Sn or an Sn alloy can be useful for a variety of applications, for example in electrical and optical devices. For example, a GeSn(Si) alloy can be used as a mobility enhancer for Ge based devices analogous to how $Si_{1-x}C_x$ is used to increase the mobility in Si NMOS applications. For example, a $Ge_{1-x}Sn_x$, and/or $Ge_{1-x-y}Si_xSn_y$ film can function as the active material in infrared detectors and emitters.

Existing Sn precursors include $SnD_4$ and $SnCl_4$. $SnD_4$ can be unstable, and therefore difficult to store or use. The excess Cl associated with $SnCl_4$ can limit growth rates and dopant incorporation in vapor deposition processes due to self-etching and removal of supplied dopants as volatile chlorinated species (e.g. $BCl_3$). Accordingly, improved Sn precursors that facilitate improved stability, storage capabilities, and/or growth rates are provided herein.

SUMMARY OF THE INVENTION

Some aspects include chemical vapor deposition methods for forming an epitaxial film comprising Sn on a substrate within a reaction chamber. The methods can include contacting an epitaxial surface of the substrate with a Sn precursor of Formula (I): $Sn(CH_3)_{4-n}X_n$, in which X=H, D, Cl or Br, and n=0, 1, 2, or 3; Formula (II): $ZSn(CH_3)_{3-n}X_n$, in which Z=H or D, X=Cl or Br, and n=0, 1, or 2; Formula (III): $Z_2Sn(CH_3)_{2-n}X_n$, in which Z=H or D, X=Cl or Br, and n=0, or 1; or Formula (IV): $SnBr_4$. A second precursor can include at least one of Si or Ge. In some embodiments, the epitaxial surface of the substrate includes Si. In some embodiments, the epitaxial film comprising Sn comprises about 20% Sn or less. In some embodiments, the epitaxial film comprising Sn comprises about 15% Sn or less. In some embodiments, the epitaxial film comprising Sn comprises about 10% Sn or less. In some embodiments, the film comprising Sn comprises about 5% Sn or less. In some embodiments, the second precursor comprises a Group III, Group IV, or Group V element. In some embodiments, the second precursor comprises a Group IV element. In some embodiments, the second precursor comprises Ge. In some embodiments, the epitaxial surface of the substrate is contacted with a dopant precursor. In some embodiments, the dopant precursor comprises at least one of B, Ga, In, As, P, and/or Sb. In some embodiments, the Sn-containing layer comprises a Sn-Group IV alloy. In some embodiments, the Sn-containing layer comprises a buffer layer for integration of Group III, Group IV, and/or Group V materials above the substrate. In some embodiments, the Sn-containing layer comprises SnGe. In some embodiments, the Sn-containing layer comprises SnSiGe. In some embodiments, the Sn-containing layer comprises a Sn—Ge alloy. In some embodiments, a Si precursor is provided in the reaction chamber. In some embodiments, the Sn-containing layer comprises a Sn—Si alloy.

Some aspects include methods for forming by chemical vapor deposition an epitaxial film comprising Sn. The methods can include providing a substrate disposed within a reaction chamber. A Sn precursor comprising Formula (I): $Sn(CH_3)_{4-n}X_n$, in which X=H, D, Cl or Br, and n=0, 1, 2, or 3; Formula (II): $ZSn(CH_3)_{3-n}X_n$, in which Z=H or D, X=Cl or Br, and n=0, 1, or 2; Formula (III): $Z_2Sn(CH_3)_{2-n}X_n$, in which Z=H or D, X=Cl or Br, and n=0, or 1; or Formula (IV): $SnBr_4$ is introduced to the chamber at temperatures of about 500° C. or less at a pressure of about atmospheric pressure or less, for example about 760 Torr or less. The Sn precursor contacts an epitaxial surface of the substrate such that an epitaxial film that comprises Sn is formed. In some embodiments, the method further includes introducing a second vapor phase precursor to the chamber. In some embodiments, the second vapor phase precursor is introduced to the chamber simultaneously with the Sn precursor. In some embodiments, the second vapor phase precursor is introduced to the chamber separately from the Sn precursor. In some embodiments, the second precursor comprises a Group IV precursor. In some embodiments, the second precursor includes at least one of Si, Ge, C, B, Ga, In, As, P, and/or Sb. In some aspects, the second precursor includes Ge.

Some aspects include a chemical reactant source vessel in combination with a gas delivery system for a vapor phase reactor for vapor processing of substrates. The source vessel can include a solid or liquid chemical reactant comprising a compound of: Formula (I): $Sn(CH_3)_{4-n}X_n$, in which X=H, D, Cl or Br, and n=0, 1, 2, or 3; Formula (II): $ZSn(CH_3)_{3-n}X_n$, in which Z=H or D, X=Cl or Br, and n=0, 1, or 2; Formula (III): $Z_2Sn(CH_3)_{2-n}X_n$, in which Z=H or D, X=Cl or Br, and n=0, or 1; or Formula (IV): $SnBr_4$. The gas delivery system can include a bubbler in fluid communication with the solid or liquid chemical reactant. In some embodiments, the gas delivery system includes a heated precursor system. Heated precursor systems can reduce or prevent condensation of reactant vapors, and thereby improve efficiency of deposition and/or lifespan of deposition equipment. Heated precursor systems are described in U.S. Pat. No. 6,699,524, which is hereby incorporated by reference in its entirety. In some embodiments, the heated precursor system includes tubular resistive heater elements.

DETAILED DESCRIPTION OF THE PREFERRED EMBODIMENT

Sn-containing thin films can be useful in a variety of applications. However, forming such films was previously difficult due to properties of precursors that were previously used. As described herein, methods are now available to deposit Sn-containing thin films via chemical vapor deposition (CVD) using improved precursors. In some embodiments, CVD includes providing a Sn precursor, for example a halogen-containing Sn precursor substituted with one or more methyl groups and/or H or D. As used herein "D" refers to deuterium. The presence of methyl groups on Sn precursors was previously believed to be undesirable because it was thought to yield films containing carbon. Surprisingly, methylation of precursors has been found to improve the quality of a crystalline film. Without being limited to any one theory, it is believed that methyl groups can have surfactant activity that can improve the quality of the deposited film. In some embodiments, etching activity is tuned by adjusting the number of substituted methyl groups in the precursor. Increasing the number of methyl groups or H, D of the Sn precursor can decrease self-etching activity of the precursor, while decreasing the number of methyl groups can increase self-etch activity of the precursor. Exemplary Sn precursors include $H_2Sn(CH_3)_2$, $HSn(CH_3)_3$, $Sn(CH_3)_4$, $Sn(CH_3)_3Cl$, $Sn(CH_3)_2Cl_2$, and $Sn(CH_3)_3Cl$. Other Sn precursors are provided below.

In some embodiments, the Sn-containing film contains other materials. In some embodiments, the Sn-containing film contains Si and/or Ge. In some embodiments, the Sn-containing film is a SnGe film. In some embodiments, the Sn containing film is an oxide. In some embodiments, the Sn-containing film is a Group IV alloy.

In some embodiments, the Sn-containing film is epitaxial as deposited. The terms "epitaxial," "epitaxially," "heteroepitaxial," "heteroepitaxially" and similar terms are used herein to refer to the deposition of a crystalline Si-containing material onto a crystalline substrate in such a way that the deposited layer adopts or follows the lattice constant of the substrate. Epitaxial deposition is heteroepitaxial when the composition of the deposited layer is different from that of the substrate; it is homoepitaxial when the deposited layer has the same composition and natural lattice constant as that of the substrate.

Single crystal Sn-containing layers having an atomic Sn content of about 20% or less can be used as stressors. Accordingly, some embodiments include epitaxial Sn-containing films containing up to about 20% atomic Sn content, for example up to about 0.5%, 1%, 2%, 3%, 4%, 5%, 6%, 7%, 8%, 9%, 10%, 11%, 12%, 13%, 14%, 15%, 16%, 17%, 18%, 19%, or 20% In some embodiments the epitaxial Sn-containing films contain up to about 15% atomic Sn.

Sn-containing films can be used in a variety of applications. In some embodiments, Sn-containing films are used in integrated circuits, for example an integrated circuit in a CMOS device. In some embodiments, a Sn-containing alloy, for example, a GeSn(Si) alloy is used as a mobility enhancer for Ge based devices. Without being bound by any particular theory, such an application is analogous to how $Si_{1-x}C_x$ can be used to increase the mobility in some Si NMOS applications. In some embodiments, an Sn-containing film is used as a source/drain stressor for Ge based devices. In some embodiments, a Sn-containing alloy is used in optical applications, such as infrared detectors and/or emitters. For example, a $Ge_{1-x}Sn_x$ and/or $Ge_{1-x-y}Si_xSn_y$ alloy can function as the active material in infrared detectors and emitters.

Single crystal Sn-containing layers having an atomic Sn content of about 20% or less can be used for optical applications, for example conduction band quantum cascade lasers or solar cells. Accordingly, some embodiments include epitaxial Sn-containing films containing up to 20% atomic Sn content, for example up to about 0.5%, 1%, 2%, 3%, 4%, 5%, 6%, 7%, 8%, 9%, 10%, 11%, 12%, 13%, 14%, 15%, 16%, 17%, 18%, 19%, or 20% In some embodiments the epitaxial Sn-containing films contain up to about 15% atomic Sn.

Chemical Vapor Deposition

In some embodiments, a Sn-containing film is deposited by CVD using one or more precursors described herein. Deposition can be suitably conducted according to the various CVD methods. CVD methods are described, for example, in U.S. Pat. No. 7,438,760, which is incorporated by reference in its entirety herein. The disclosed methods can be suitably practiced by employing CVD. In some embodiments, CVD is thermal. In some embodiments, CVD is plasma-enhanced chemical vapor deposition (PECVD). In some embodiments, the Sn-containing film is an epitaxial Sn film.

In the following description, reference may be made to the use of Sn precursor of Formula (I), (II), (III), or (IV) (which may also be referred to herein as "a Sn precursor of Formulas (I)-(IV)" or similar language) to deposit a Sn or Sn-containing film. It will be recognized that those descriptions are also generally applicable to the deposition of other Sn-containing films, e.g., the deposition of SnGe:C films (involving the use of a germanium source), to the deposition of electrically doped Sn:C and SnGe:C films (involving the use of a dopant precursor for an electrical dopant) and to selective depositions (e.g., involving the use of an etchant source), unless otherwise stated. Thermal CVD is preferred in some embodiments, as deposition can be achieved effectively without the risk of damage to substrates and equipment that attends plasma processing.

The Sn precursor and, optionally one or more additional reactants including an etchant gas and/or an electrical dopant precursor, are preferably introduced to the chamber in the form of separate gases or by intermixing to form a feed gas. The intermixing to form the feed gas may take place in the chamber or prior to introduction of the feed gas to the chamber. The total pressure in the CVD chamber is preferably in the range of about $10^{-5}$ Torr to about 1000 Torr, more preferably in the range of about $10^{-4}$ Torr to about atmospheric pressure, for example about 760 Torr. In some embodiments, the chemical vapor deposition conditions comprise a chamber pressure of at least about $10^{-5}$ Torr, preferably a chamber pressure of about 760 Torr or less, for example a pressure of about 760 Torr, 740 Torr, 720 Torr, 700 Torr, 680 Torr, 660 Torr, 640 Torr, 620 Torr, 600 Torr, 580 Torr, 560 Torr, 540 Torr, 520 Torr, 500 Torr, 480 Torr, 460 Torr, 440 Torr, 420 Torr, 400 Torr, 350 Torr, 300 Torr, 250 Torr, 200 Torr, 150 Torr, or less, or a pressure in the range of about $10^{-4}$ Torr to about 760 Torr, for example about $10^{-4}$ Torr, $10^{-3}$ Torr, $10^{-2}$ Torr, $10^{-1}$ Torr, 1 Torr, 5 Torr, 10 Torr, 30 Torr, 50 Torr, 100 Torr, 150 Torr, 200 Torr, 250 Torr, 300 Torr, 350 Torr, 400 Torr, 450 Torr, 500 Torr, 600 Torr, 650, 700 Torr, 750 Torr, or 760 Torr, including ranges between any two of the listed values. The chamber pressure may be referred to herein as a deposition pressure. The partial pressure of Sn precursor is preferably in the range of about 0.0001% to about 100% of the total pressure, more preferably about 0.001% to about 50% of the total pressure. In some embodiments, the temperature of the CVD reaction chamber is about 600° C. or less, for example about 550° C. or less. In some embodiments, the temperature of the reaction chamber is about 500° C. or less, for example, about 500° C., 490° C., 480° C., 470° C., 460° C., 450° C., 440° C., 430° C., 420° C., 410° C., 400° C., 375° C., 350° C., 325° C., or 300° C. or less.

In some embodiments, the feed gas also includes a gas or gases other than Sn precursor, such as other Sn sources, etchant sources, dopant precursor(s) and/or inert carrier gases, but preferably a precursor of one of Formulas (I)-(IV) is the sole source of Sn. In some embodiments, an elemental Sn film is produced.

In some embodiments, a second precursor is introduced into the chamber. In some embodiments, the second precursor is introduced into the chamber at the same time as the Sn precursor. In some embodiments, the second precursor is introduced into the chamber after the Sn precursor is introduced. In some embodiments, the second precursor is introduced into the chamber before the Sn precursor is introduced. In some embodiments, the second precursor includes a Si precursor, for example silane, disilane, trisilane, tetrasilane, monochlorosilane, dichlorosilane, trichlorosilane, trichlorodisilane, neopentasilane, and/or a Ge precursor, for example germane. Accordingly, in some embodiments, a compound film is produced. Compound films can include, for example, SnGe, SnSi, and/or SnSiGe films.

The term "dopant precursor(s)" is used herein to refer in a general way to various materials that are precursors to various elements (e.g., boron, gallium, indium, arsenic, phosphorous, and/or antimony) that can be incorporated into the resulting deposited film in relatively minor amounts. It will be recognized that Sn sources may also be considered dopant precursors for the deposition of Sn alloy films that contain relatively minor amounts of Sn. The term "dopant" typically refers to the addition of a small amount of a material that modifies the electrical or optical properties of the bulk material.

Examples of suitable carrier gases for the methods described herein include He, Ar, $H_2$, and $N_2$. In certain embodiments, the carrier gas is a non-hydrogen carrier such as He, Ar and/or $N_2$. Preferably, the Sn precursor is introduced to the chamber by way of a vaporizer such as a bubbler used with a carrier gas to entrain Sn precursor vapor, more preferably by way of a delivery system comprising a bubbler and a gas concentration sensor that measures the amount of Sn precuror in the carrier gas flowing from the bubbler. Such sensors are commercially available, e.g., PIEZOCON™ gas concentration sensors from Lorex Industries, Poughkeepsie, N.Y., U.S.A.

In some embodiments, a gaseous chlorine-containing etchant (such as HCl or, more preferably, chlorine) is introduced to the chamber in with the Sn precursor to thereby selectively deposit a single crystalline Sn-containing film. In some embodiments, the etchant and Sn precursor are introduced simultaneously. In some embodiments, the Sn precursor is introduced, and the etchant is then introduced, such that the introduction of etchant overlaps with the introduction of Sn precursor. In some embodiments, the Sn precursor is introduced, and the etchant is introduced after the cessation of the introduction of the Sn precursor. In some embodiments, the Sn precursor of Formulas (I)-(IV) includes at least one halogen atom (e.g. Cl or Br), and has etchant activity. In some embodiments, the etching activity of the Sn precursor is tuned by selecting a halogenated Sn precursor having one or more substituted methyl groups or H,D. The etching activity can be decreased by selecting a precursor with a relatively greater number of methyl groups or H,D, or can be increased by selecting a precursor with a relatively smaller number of substituted methyl groups. Accordingly, in some embodiments, the Sn precursor is introduced to the chamber in the absence of an additional etchant such as HCl.

The Sn-containing film is deposited on a substrate in a reaction chamber. In some embodiments, the substrate comprises, consists of, or consists substantially of Si. In some embodiments, a substrate includes an epitaxial layer. The epitaxial layer can be positioned on a surface of the substrate. A Sn-containing film can be grown on the epitaxial layer. In some embodiments, the substrate includes a Group III and/or Group V element. In some embodiments, the epitaxial layer of the substrate includes a Group III and/or Group V element. In some embodiments, the substrate comprises, consists of, or consists substantially of a Group III element. Exemplary Group III elements include B, Al, Ga, In, and Ti. In some embodiments, the substrate comprises, consists of, or consists substantially of two or more Group III elements, for example $In_xGa_{1-x}$. In some embodiments, the substrate comprises, consists of, or consists substantially of at Group V element. Exemplary Group V elements include N, P, As, Sb, and Bi. In some embodiments, the substrate comprises, consists of, or consists substantially of two or more Group V elements. In some embodiments, the substrate comprises, consists of, or consists substantially of at least one Group III element, and at least one Group V element, for example an alloy of the formula $Ti_xN_{1-x}$.

A suitable manifold may be used to supply feed gas(es) to the CVD chamber. In some embodiments, the CVD chamber is in a single wafer reactor, e.g., a single wafer, horizontal gas flow CVD chamber. Most preferably, the CVD chamber is in a single-wafer, single pass, laminar horizontal gas flow reactor, preferably radiantly heated. Suitable reactors of this type are commercially available, and preferred models include the EPSILON™ series of single wafer reactors commercially available from ASM America, Inc. of Phoenix, Ariz.: While the methods described herein can also be employed in alternative reactors, such as a showerhead arrangement, benefits in increased uniformity and deposition rates have been found particularly effective in the horizontal, single-pass laminar gas flow arrangement of the EPSILON™ chambers, employing a rotating substrate, particularly with low process gas residence times. CVD may be conducted by introducing plasma products (in situ or downstream of a remote plasma generator) to the chamber, but as noted above, thermal CVD is preferred.

In some embodiments, a doped Sn film is deposited using at least a Sn precursor and a dopant precursor. Frequently dopants include include C, Ge, B, Ga, In, As, P, and/or Sb. The amount of dopant precursor in the feed gas may be adjusted to provide the desired level of dopant in the Sn-containing film. Preferred concentrations of dopant precursor in the feed gas are in the range of about 1 part per billion (ppb) to about 20% by weight based on the total weight of reactive gas (excluding inert carrier and diluent gases). For electrical dopants, preferred concentrations of dopant precursor (e.g., pure phosphine or equivalent diluted phosphine, arsine or diborane) in the feed gas are preferably between about 0.1 standard cubic centimeters per minute (sccm) to about 5 sccm, although higher or lower amounts are sometimes preferred in order to achieve the desired property in the resulting film. In the preferred EPSILON™ series of single wafer reactors, dilute mixtures of the dopant precursor in a carrier gas can be delivered to the reactor via a mass flow controller with set points ranging from about 10 sccm to about 1000 sccm, depending on desired dopant concentration and dopant gas concentration. Dilution of dopant gases can lead to factors of $10^{-7}$ to $10^{-2}$ to arrive at equivalent pure dopant flow rates. Typically commercially available dopant sources are dopant hydrides diluted in $H_2$, e.g., 1% arsine or 1% phosphine in $H_2$. In some embodiments dopant precursors are diluted in a non-hydrogen inert gas. The dilute mixture is preferably further diluted by mixing with Sn precursor, etchant (for selective deposition embodiments), any suitable carrier gas, and the desired strain-influencing precursor for substitutional doping (e.g., for substitutional carbon doping, a carbon source such as MMS). Since typical total flow rates for deposition in the preferred EPSILON™ series reactors often range from about 20 standard liters per minute (slm) to about 180 slm, the concentration of the dopant precursor used in such a method is generally small relative to total flow.

In some embodiments, an epitaxial Sn film comprising at least one of Si or Ge is deposited by CVD. A first reactant that includes a Sn precursor as described herein, for example a Sn precursor of one of Formula (I)-(IV), can be flowed into the reaction chamber. A second reactant that includes a Si and/or Ge precursor flowed into the reaction chamber. The first and second reactant can contact the substrate surface (or the surface of a film growing on the substrate) such that an epitaxial Sn film is deposited. Optionally, a dopant can be provided, for example, simultaneously with, intermittently with, or following the introduction of the Sn precursor and/or the Si or Ge precursor. In some embodiments, an Sn-containing film is formed. In some embodiments, the Sn-containing film is one of a GeSn, SiSn, or GeSiSn film.

Sn-Containing Films

In some embodiments, the Sn-containing film is an elemental Sn film. In some embodiments, the Sn-containing film is Sn alloy film. In some embodiments, the Sn-containing film is an SnGe film, for example a film of the formula $Ge_{1-x}Sn_x$ in which $0<x<1$.

With respect to films that contain, Group III-IV, and V materials (which may also be referred to herein at "Group III-V") the Sn containing alloys can act as a buffer layer for integration of Group III-V materials on Si substrates. Accordingly, in some embodiments, the Sn-containing film is a Sn and Group III-V alloy. In some embodiments, the Sn-containing film is an Sn-Group III alloy. Exemplary Group III elements include B, Al, Ga, In, and Ti. In some embodiments, the Sn alloy includes two or more Group III elements.

n some embodiments, the Sn-containing film is a Group IV alloy. In some embodiments, the Group IV alloy includes one Group IV element in addition to Sn. Exemplary alloys include $Si_{1-x}Sn_x$, $C_{1-x}Sn_x$, $Ge_{1-x}Sn_x$, $Pb_{1-x}Sn_x$, $Ti_{1-x}Sn_x$, $Zr_{1-x}Sn_x$, $Zr_{1-x}Sn_x$, $Hf_{1-x}Sn_x$. In some embodiments, the Group IV alloy includes two or more Group IV elements in addition to Sn. Exemplary alloys include $Si_{1-x-y}Ge_xSn_y$. In some embodiments, the Sn-containing film is an Sn-Group V alloy. Exemplary Group V elements include N, P, As, Sb, and Bi. In some embodiments, the alloy includes two or more Group III elements. In some embodiments, the alloy includes two or more Group V elements. In some embodiments, the substrate comprises, consists of, or consists substantially of at least one Group III element, and at least one Group V element. In some embodiments, gasses comprising each element of the alloy are provided simultaneously.

In some embodiments, the Sn-containing film is a doped Sn film. In some embodiments, the doping is substitutional (e.g. where one or more dopant replaces Sn or another Group IV element in the lattice structure). In some embodiments, the doping is non-substitutional (e.g. where one or more dopant diffuses interstitially into the lattice structure). Exemplary dopants include B, Ga, In, As, P, and/or Sb. In some embodiments, the dopant precursor is provided intermittently with the Sn precursor, and/or the Si or Ge precursor. In some embodiments, the dopant precursor is provided after the Sn precursor and/or Si or Ge precursor is provided. In some embodiments, the dopant precursor is provided after the Sn precursor and/or Si or Ge precursor. In some embodiments, the introduction of the dopant precursor overlaps the introduction of the Sn and/or Si or Ge precursor. In some embodiments, the introduction of the dopant precursor is separate from the introduction of the Sn precursor, and/or Si or Ge precursor. In some embodiments, an as-deposited substitutionally doped film is formed.

In some embodiments, the Sn-containing film contains about 20% Sn or less, for example about 20%, 19%, 18%, 17%, 16%, 15%, 14%, 13%, 12%, 11%, 10%, 9%, 8%, 7%, 6%, 5%, 4%, 3%, 2%, 1.5%, 1%, or 0.5% Sn. In some embodiments, Sn acts as a stressor for an epitaxial later. In some embodiments, a Sn-containing stressor layer includes $Si_{1-x}Sn_x$, and/or $Si_{1-x-y}Ge_xSn_y$. In some embodiments, a Sn-containing stressor layer contains about 15% Sn or less, for example, about %, 15%, 14%, 13%, 12%, 11%, 10%, 9%, 8%, 7%, 6%, 5%, 4%, 3%, 2%, 1.5%, 1%, 0.9%, 0.5%, or 0.1% Sn. In some embodiments, a Sn-containing stressor layer contains about 10% Sn or less, for example, about 10%, 9%, 8%, 7%, 6%, 5%, 4%, 3%, 2%, 1.5%, 1%, 0.9%, 0.5%, or 0.1% Sn.

Sn Precursors

Some embodiments include Sn vapor precursors of formula (I), (II), (III), or (IV). Reference herein is made to deuterium, which may be notated as "D" or "$^2$H" herein.

$$Sn(CH_3)_{4-n}X_n, \text{ in which } X=H, D, Cl \text{ or } Br, \text{ and } n=0, 1, 2, \text{ or } 3. \quad \text{Formula (I)}$$

$$ZSn(CH_3)_{3-n}X_n, \text{ in which } Z=H \text{ or } D, X=Cl \text{ or } Br, \text{ and } n=0, 1, \text{ or } 2. \quad \text{Formula (II)}$$

$$Z_2Sn(CH_3)_{2-n}X_n, \text{ in which } Z=H \text{ or } D, X=Cl \text{ or } Br, \text{ and } n=0, \text{ or } 1. \quad \text{Formula (III)}$$

$$SnBr_4 \quad \text{Formula (IV)}$$

The Sn precursors of Formulas (I)-(IV) can be more stable than $SnD_4$. The higher stability of the Sn precursors of Formulas (I)-(IV) can facilitate storage, and usage in at least some applications.

$SnCl_4$ can limit film growth in deposition applications due to self-etching. However, the Sn precursors of Formulas (I)-(IV) produce stoichiometrically fewer Cl (or other halogen) ions than $SnCl_4$, and thus can offer at least some tailoring of etch back. Assuming otherwise comparable deposition conditions, the amount of etch back can correlate negatively to the proportion of halogen atoms present in a molecule of the Sn precursor (e.g. $Sn(CH_3)_4$ exhibits less etch back than $Sn(CH_3)_3Cl$, which exhibits $Sn(CH_3)_2Cl_2$, etc.). Thus, in some embodiments, even if a Sn precursor of one of Formulas (I)-(IV) exhibits some etch back, there can be net growth. Accordingly, in some embodiments, deposition using the Sn precursors of Formulas (I)-(IV) results in higher growth rates than $SnCl_4$ under otherwise identical conditions.

As noted herein, the Sn precursors of Formulas (I)-(IV) can have at least some self-etching activity. Additionally, HCl, while useful as an etchant, can have relatively low effectiveness at low temperatures (e.g. less than about 500° C.). Accordingly, some embodiments include deposition in which HCl is not added as an etchant, and in which the Sn precursor of one of Formulas (I)-(IV) includes at least one halogen atom, and thus has some etching activity.

The Sn precursors of Formulas (I)-(IV) each include at least one methyl group. Some deposition applications can include elimination of methyl groups from the growth surface. Such elimination of methyl groups can produce a pseudo surfactant effect, which can improve the quality of the deposited film. Accordingly, in some embodiments, deposition using the Sn precursors of Formulas (I)-(IV) can include a pseudo surfactant effect.

Source Vessels

Some embodiments include chemical reactant source vessels. In some embodiments, the source vessel is in combination with a gas delivery system for a vapor phase reactor for vapor processing of substrates. The source vessel can include a solid or liquid chemical reactant comprising a Sn-containing compound selected from the group consisting of: Formula (I), Formula (II), Formula (III), or Formula (IV). In some embodiments, the source vessel includes two or more Sn-containing precursors. In some embodiments, the vapor phase reactor can include a bubbler in fluid communication with the solid or liquid chemical reactant. In some embodiments, the source vessel can be in gas communication with a heated precursor delivery system.

Example 1

A Si substrates is positioned in a reaction chamber under CVD conditions. $Sn(CH_3)_3Cl$ is intermixed with an $N_2$ feed gas, and then flowed into the reaction chamber. A germane precursor is flowed into the reaction chamber. The reaction chamber temperature is maintained at about 200 Torr and a temperature of about 275° C. A SnGe film is deposited.

What is claimed is:

1. A CVD method for forming an epitaxial film comprising Sn on a substrate within a reaction chamber, the method comprising:
providing a substrate disposed within a reaction chamber; and
contacting an epitaxial surface of the substrate with a Sn precursor comprising:

$Sn(CH_3)_{4-n}X_n$, in which X=H, D, Cl or Br, and $n$=0, 1, 2, or 3;    Formula (I)

$ZSn(CH_3)_{3-n}X_n$, in which Z=H or D, X=Cl or Br, and $n$=0, 1, or 2; or    Formula (II)

$Z_2Sn(CH_3)_{2-n}X_n$, in which Z=H or D, X=Cl or Br, and $n$=0, or 1;    Formula (III)

and
a second precursor comprising at least one of Si or Ge, thereby forming an epitaxial film comprising Sn.

2. The method of claim 1, wherein the epitaxial surface of the substrate comprises Si.

3. The method of claim 1, wherein the film comprising Sn comprises about 20% Sn or less.

4. The method of claim 1, wherein the film comprising Sn comprises about 5% Sn or less.

5. The method of claim 1, wherein the second precursor comprises a Group III, Group IV, or Group V element.

6. The method of claim 1, wherein the second precursor comprises a Group IV element.

7. The method of claim 1, wherein the second precursor comprises Ge.

8. The method of claim 1, further comprising contacting the epitaxial surface of the substrate with a dopant precursor.

9. The method of claim 8, wherein the dopant precursor comprises at least one of B, Ga, In, As, P, or Sb.

10. The method of claim 2, wherein the film comprising Sn comprises a buffer layer for integration of Group III, Group IV, or Group V materials above the substrate.

11. The method of claim 1, wherein the film comprising Sn comprises a Sn-Group IV alloy.

12. The method of claim 1, wherein the film comprising Sn comprises SnGe.

13. The method of claim 1, wherein the film comprising Sn comprises SnSiGe.

14. A method for forming by chemical vapor deposition an epitaxial film comprising Sn, the method comprising:
providing a substrate disposed within a reaction chamber;
introducing at a total reaction chamber pressure of about 760 Torr to about $10^{-5}$ Torr and a temperature of about 500° C. or less a vapor phase Sn precursor comprising:

$Sn(CH_3)_{4-n}X_n$, in which X=H, D, Cl or Br, and $n$=0, 1, 2, or 3;    Formula (I)

$ZSn(CH_3)_{3-n}X_n$, in which Z=H or D, X=Cl or Br, and $n$=0, 1, or 2; or    Formula (II)

$Z_2Sn(CH_3)_{2-n}X_n$, in which Z=H or D, X=Cl or Br, and $n$=0, or 1;    Formula (III)

and
contacting the Sn precursor with an epitaxial surface of the substrate such that an epitaxial film comprising Sn is formed.

15. The method of claim 14, further comprising introducing a second vapor phase precursor to the chamber under chemical vapor conditions.

16. The method of claim 15, wherein the second precursor is introduced simultaneously with the Sn precursor.

17. The method of claim 15, wherein the second precursor is introduced separately from the Sn precursor.

18. The method of claim 15, wherein the second precursor comprises at least one Group III, IV, or V precursor.

19. The method of claim 15, wherein the second precursor comprises at least one of Si, Ge, C, B, Ga, In, As, P, and/or Sb.

20. The method of claim 15, wherein the second precursor comprises Ge.

* * * * *

UNITED STATES PATENT AND TRADEMARK OFFICE
CERTIFICATE OF CORRECTION

| | |
|---|---|
| PATENT NO. | : 8,921,207 B2 |
| APPLICATION NO. | : 13/783762 |
| DATED | : December 30, 2014 |
| INVENTOR(S) | : John Tolle |

It is certified that error appears in the above-identified patent and that said Letters Patent is hereby corrected as shown below:

Title page

In column 2 (page 1, item 56) at line 17, Under Other Publications, change "Enabeling" to --Enabling--.

In column 2 (page 1, item 56) at line 17, Under Other Publications, change "www.sagchitech.com," to --www.safchitech.com,--.

Page 1 (item 57, Abstract) at line 5, change "deuteriated." to --deuterated.--.

Specification

In column 1 at line 42, Change "X=H," to --X=H,--.

In column 1 at line 43, Change "Z=H" to --Z=H--.

In column 1 at line 44, Change "X=Cl" to --X=Cl--.

In column 1 at line 45, Change "Z=H" to --Z=H--.

In column 1 at line 45, Change "X=Cl" to --X=Cl--.

In column 2 at line 9, Change "X=H," to --X=H,--.

In column 2 at line 10, Change "Z=H" to --Z=H--.

In column 2 at line 10, Change "X=Cl" to --X=Cl--.

In column 2 at line 12, Change "Z=H" to --Z=H--.

In column 2 at line 12, Change "X=Cl" to --X=Cl--.

In column 2 at line 32, Change "X=H," to --X=H,--.

In column 2 at line 34, Change "Z=H" to --Z=H--.

In column 2 at line 34, Change "X=Cl" to --X=Cl--.

In column 2 at line 35, Change "Z=H" to --Z=H--.

In column 2 at line 35, Change "X=Cl" to --X=Cl--.

In column 5 at line 22, Change "precuror" to --precursor--.

Signed and Sealed this
Eighth Day of December, 2015

Michelle K. Lee
*Director of the United States Patent and Trademark Office*

CERTIFICATE OF CORRECTION (continued)
U.S. Pat. No. 8,921,207 B2

Specification

In column 6 at line 25, Change "include include" to --include--.

In column 8 at line 9 (approx.), Change "X=H," to --X=H,--.

In column 8 at line 13 (approx.), Change "Z=H" to --Z=H--.

In column 8 at line 13, Change "X=Cl" to --X=Cl--.

In column 8 at line 16 (approx.), Change "Z=H" to --Z=H--.

In column 8 at line 16, Change "X=Cl" to --X=Cl--.

Claims

In column 9 at line 17, In Claim 1, change "X=H," to --X=H,--.

In column 9 at line 20, In Claim 1, change "Z=H" to --Z=H--.

In column 9 at line 20, In Claim 1, change "X=Cl" to --X=Cl--.

In column 9 at line 22, In Claim 1, change "Z=H" to --Z=H--.

In column 9 at line 22, In Claim 1, change "X=Cl" to --X=Cl--.

In column 10 at line 17 (approx.), In Claim 14, change "X=H," to --X=H,--.

In column 10 at line 20, In Claim 14, change "Z=H" to --Z=H--.

In column 10 at line 20, In Claim 14, change "X=Cl" to --X=Cl--.

In column 10 at line 23 (approx.), In Claim 14, change "Z=H" to --Z=H--.

In column 10 at line 23 (approx.), In Claim 14, change "X=Cl" to --X=Cl--.